(12) United States Patent
Kohara et al.

(10) Patent No.: US 7,737,368 B2
(45) Date of Patent: *Jun. 15, 2010

(54) CIRCUIT BOARD AND METHOD OF MANUFACTURING CIRCUIT BOARD

(75) Inventors: Yasuhiro Kohara, Gifu (JP); Ryosuke Usui, Ichinomiya (JP); Noriaki Kojima, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 139 days.

This patent is subject to a terminal disclaimer.

(21) Appl. No.: 11/536,317

(22) Filed: Sep. 28, 2006

(65) Prior Publication Data

US 2007/0074904 A1 Apr. 5, 2007

(30) Foreign Application Priority Data

Sep. 30, 2005 (JP) ............................. 2005-286299
Sep. 30, 2005 (JP) ............................. 2005-286300

(51) Int. Cl.
*H05K 1/11* (2006.01)
(52) U.S. Cl. ........................ 174/266; 428/209; 428/901
(58) Field of Classification Search ................. 428/209, 428/901; 174/266
See application file for complete search history.

(56) References Cited

U.S. PATENT DOCUMENTS 5,346,750 A * 9/1994 Hatakeyama et al. ....... 428/209
5,972,482 A * 10/1999 Hatakeyama et al. ....... 428/209
6,518,515 B2 * 2/2003 Nishii et al. ................. 174/262

FOREIGN PATENT DOCUMENTS

| CN | 1248881 | 3/2000 |
| JP | 2-194689 | 8/1990 |
| JP | 05-055401 | 3/1993 |
| JP | 5-235544 | 9/1993 |
| JP | 2002-232102 | 8/2002 |
| JP | 2002-237681 | 8/2002 |
| JP | 2002-299784 | 10/2002 |
| JP | 2005-086164 | 3/2005 |

* cited by examiner

*Primary Examiner*—Cathy Lam
(74) *Attorney, Agent, or Firm*—Fish & Richardson P.C.

(57) ABSTRACT

A circuit board includes: a plurality of wiring layers; an insulating layer which insulates the plurality of wiring layers, the insulating layer containing a fibrous filler and a resin; and a conductor part formed on a sidewall of a via piercing through the insulating layer. The fibrous filler protrudes from the sidewall and is covered with the conductor part, with a length greater than the thickness of the conductor layer.

7 Claims, 7 Drawing Sheets

Rz1 > Rz2
Z1 > Z2

Rz1 > Rz2
Z1 > Z2

CIRCUIT BOARD AND METHOD OF MANUFACTURING CIRCUIT BOARD

BACKGROUND OF THE INVENTION

1. Field of the Invention

The invention relates to a technology for circuit boards which have an insulating layer containing a fibrous filler. In particular, the invention relates to a technology for circuit boards in which metal or other conductor parts have excellent adhesion to the insulating layer, and the metal or other conductor parts formed on the insulating layer provide an excellent heat radiation capability.

2. Description of the Related Art

With the advances of LSIs in performance and functionality in recent years, their power consumption has also been on the increase. Furthermore, with the miniaturization of electronic equipment, smaller sized substrates have also required, along with higher densities and multilayer structures. The power consumption per unit volume of a circuit board (heat density) has therefore been growing, and measures to address this increased heat radiation have been increasingly demanded.

There is a structure known for multilayer boards in which vias are formed in order to establish conduction between the individual layers of the multilayered boards. This structure is known to suppress rises in temperature. Insulating layers made of a mixture of resin and glass fibers have also been used to provide improved strength and functionality.

Japanese Patent Laid-Open Publication No. Hei 5-55401 discloses a printed wiring board having a spot-faced organic resin substrate, in which a large number of hair-like fibers exposed in the sidewalls of the formed recesses are covered with a through-hole plating layer.

Japanese Patent Laid-Open Publication No. 2002-237681 discloses a printed wiring board having an insulating substrate, in which solder filling holes for preventing solder from coming off the insulating substrate are formed by laser irradiation so that the ends of fibers protruding from the sidewalls bite into the solder.

The fibers exposed perpendicularly from the sidewalls of the recesses, however, can only have lengths as long as coverable by the through-hole plating layer, i.e., their length is dependent on the thickness of the copper plating. For that reason, the copper plating may possibly exfoliate from the insulating resin when exposed to high heat loads.

Moreover, with the multilayer boards, it is not always possible to fill the holes with solder in every location. Furthermore, when the through-hole plating layer just covers the fibers just flatly, it can only provide substantially the same heat radiation capability as that of ordinary plating layers.

SUMMARY OF THE INVENTION

The present invention has been developed in view of the foregoing circumstances. It is thus an object of the present invention to provide a technology for improving the adhesion between the insulating layer and the conductor parts of a circuit board and for improving the heat radiation capability of the metal and other conductor parts formed on the insulating layer.

One of the aspects of the present invention is a circuit board. This circuit board includes: a plurality of wiring layers; an insulating layer which insulates the plurality of wiring layers, the insulating layer containing a fibrous filler and a resin; and a conductor part formed on a sidewall of a via hole piercing through the insulating layer. The fibrous filler protrudes from the sidewall and is covered with the conductor part, with a length greater than the thickness of the conductor part. In terms of heat radiation capability and strength, glass fibers are suitably used as the fibrous filler.

According to this aspect, the fibrous filler to be covered by the conductor part has a length greater than the thickness of the conductor part. This can improve the adhesion between the insulating layer and the conductor part by creating an anchoring effect. It should be appreciated that not all the fibers of the filler need to be longer than the thickness of the conductor part. The foregoing effect can be achieved as long as at least one single fiber of the filler has such a length.

The conductor part is not limited to ones that only function as an electrical conduction part for establishing conduction between the plurality of wiring layers and thereby forming multilayer wiring, but shall also cover ones that function as a heat transfer channel for heat radiation. The conductor part is preferably made of a metal that can be formed by plating. For example, the conductor part may be formed by copper plating.

When the conductor part is made of copper plating, the biting of the glass fibers, having a smaller coefficient of thermal expansion, into the copper plating lowers the coefficient of thermal expansion of the copper plating since the coefficient of thermal expansion of glass and that of copper are combined. Consequently, this can reduce the expansion of the copper plating under heat loads, thereby suppressing the occurrence of cracks near the border between the resin and the copper plating.

In the foregoing aspect, the via hole is preferably formed by drilling. The drill rotation during machining tends to make glass fibers protruding from the sidewall oblique to the sidewall, so that the protruding glass fibers are likely to have lengths greater than the thickness of the conductor part.

Now, another aspect of the present invention is a method for manufacturing a circuit board. This method for manufacturing a circuit board includes: drilling a via hole in an insulating layer which insulates a plurality of wiring layers, the insulating layer containing a fibrous filler and a resin; performing a process for dissolving only a resin area of a sidewall of the via hole; and forming a conductor part on the resin-dissolved sidewall by a plating process.

According to this aspect, the process for dissolving the resin area of the sidewall is performed before the plating process. Since the resin area of the sidewall is dissolved, the fibrous filler contained in the insulating layer can be exposed more. This makes it possible to protrude the fibers of the filler longer than the thickness of the conductor part. In terms of heat radiation capability and strength, glass fibers are suitably used as the fibrous filler.

Another aspect of the present invention is a circuit board. This circuit board includes: a plurality of wiring layers; an insulating layer which insulates the plurality of wiring layers, the insulating layer containing a fibrous filler and a resin; and a conductor part formed on a sidewall of a via hole piercing through the insulating layer. The conductor part has a greater surface roughness in a region where it covers the fibrous filler protruding from the sidewall than that in a region where it covers the sidewall from which the fibrous filler does not protrude. In terms of heat radiation capability and strength, glass fibers are suitably used as the fibrous filler.

According to this aspect, the conductor part has a greater surface roughness in the region where it covers the fibrous filler protruding from the sidewall than that in the region where it covers the sidewall from which the fibrous filler does not protrude. The conductor part therefore increases in surface area where it covers the fibrous filler. As a result, the entire conductor part formed on the sidewall of the via hole increases in surface area so as to improve heat radiation capability. In particular, the surface area of the conductor part increases in the region where it covers the fibrous filler. This facilitates radiating heat through the fibrous filler of favorable thermal conductivity. It should be appreciated that the surface roughness may be rendered in values that are associated with surface areas, such as an arithmetic mean roughness Ra and a ten-point height of irregularities Rz which are defined in JIS (Japanese Industrial Standards) B0601.

As employed herein, the conductor part is not limited to ones that only function as an electrical conduction part for establishing conduction between the plurality of wiring layers and thereby making multilayer wiring, but shall also cover ones that function as a heat transfer channel for heat radiation. The conductor part is preferably made of a metal that can be formed by plating. For example, the conductor part may be formed by copper plating.

When the conductor part is made of copper plating, the biting of the glass fibers, having a smaller coefficient of thermal expansion, into the copper plating lowers the coefficient of thermal expansion of the copper plating since the coefficient of thermal expansion of glass and that of copper are combined. Consequently, this can reduce the expansion of the copper plating under heat loads, thereby suppressing the occurrence of cracks near the border between the resin and the copper plating.

In the foregoing aspect, the via hole is preferably formed by drilling. The drilling facilitates the fibrous filler protruding from the sidewall, thereby increasing the surface roughness of the conductor part to be formed later.

In the foregoing aspect, the conductor part preferably has a greater thickness in the region where it covers the fibrous filler protruding from the sidewall than in the region where it covers the sidewall from which the fibrous filler does not protrude. Since the conductor part in the region where it covers the fibrous filler protruding from the sidewall has a thickness greater than usual, it is possible to increase the volume of the conductor part and improve the heat radiation capability thereof. In addition, a step formed between the regions of different thicknesses can increase the surface area, thereby improving the heat radiation capability further.

Another aspect of the present invention is a method for manufacturing a circuit board. This method is one for manufacturing a circuit board having an insulating layer which insulates a plurality of wiring layers, the insulating layer containing a fibrous filler cyclically varying in density and a resin for filling gaps between fibers of the filler. The method includes: drilling a via hole in the insulating layer; performing a process for dissolving only a resin area of a sidewall of the via hole; and forming a conductor part on the resin-dissolved sidewall by a plating process.

According to this aspect, the process for dissolving the resin area of the sidewall is performed before the plating process. Since the resin area of the sidewall is dissolved, the fibrous filler contained in the insulating layer can be exposed more. This can make the surface roughness of the conductor part greater in a region where it covers the fibrous filler protruding from the sidewall than in a region where it covers the sidewall from which the fibrous filler does not protrude.

As employed herein, the phrase "cyclically varying in density" refers to such cases that the fibers of the filler are interwoven in a mesh-like configuration, and that the fibers of the filler are arranged so as to rise and fall in density at least in one direction. More specifically, the phrase covers the cases where the number of fibers per unit area varies cyclically. In terms of heat radiation capability and strength, glass fibers are suitably used as the fibrous filler.

It should be appreciated that any appropriate combinations of the foregoing components are also intended to fall within the scope of the invention covered by a patent to be claimed by this patent application. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Hereinafter, the embodiments of the present invention will be described with reference to the drawings. It should be appreciated that the following configurations are given solely by way of example, and by no means intend to limit the invention.

First Embodiment (Structure of Circuit Board)

Figure 2:
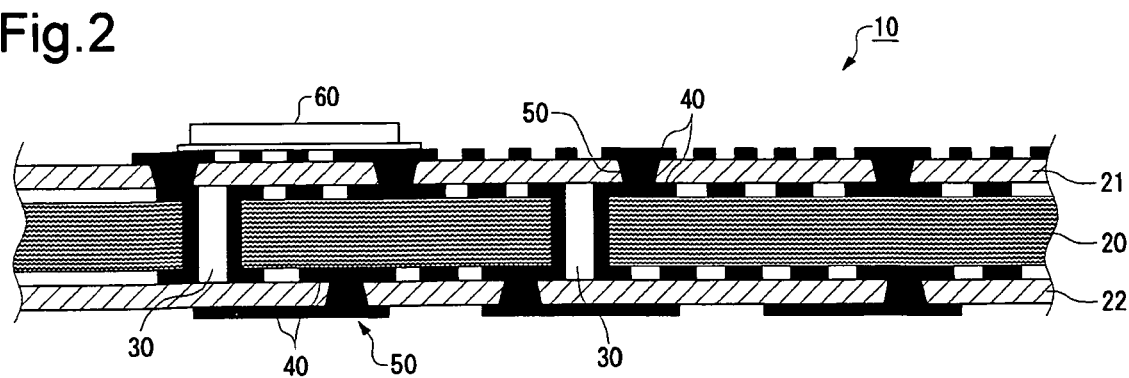
FIG. 2 is a sectional view showing the structure of a multilayer circuit board according to a first embodiment.

FIG. 2 is a sectional view showing the structure of a multilayer circuit board 10 according to a first embodiment of the present invention. The circuit board 10 includes a plurality of insulating layers 20, 21, and 22, vias 30, a plurality of wiring layers 40, and via plugs 50. The vias 30 are formed to pierce through the insulating layer 20. The wiring layers 40 are formed between the plurality of insulating layers 20, 21, and 22, or on the surfaces of the insulating layers 20, 21, and 22. The via plugs 50 establish conduction between the respective wiring layers 40 in the direction perpendicular to the circuit board 10.

The insulating layer 20 is made of glass cloth that is impregnated with an insulative resin 24. Suitable resins include organic resins such as epoxy resins, melamine derivatives such as BT resin, liquid crystal polymers, PPE resins, polyimide resins, fluorine resins, phenol resins, and polyamide bismaleimides. The glass cloth to be impregnated with the resin is preferably formed in three layers. In this instance, one single layer refers to a configuration where glass fibers extending in respective different directions cross each other. The three layers thus refer to the state where this unit configuration is stacked up to three stages in the vertical direction.

In the first embodiment, a copper-foiled epoxy resin laminate having a flame-resistant woven glass cloth matrix (such as FR-4) is used. FR-4 has a thermal conductivity of 0.33 W/mK and a withstand voltage of 29 MV/mm (when the applied voltage has a frequency of 50 Hz).

The vias 30 function as thermal vias for allowing heat occurring from heating elements arranged on the surface of the circuit board 10, such as an LSI chip 60, to emanate to the back side of the circuit board 10.

The wiring layers 40 are suitably made of copper wiring formed by plating. The via plugs 50 may also be made of copper, the same material as that of the wiring layers 40. This provides favorable conduction across the interfaces between the via plugs 50 and the wiring layers 40.

The circuit board 10 in accordance with the first embodiment therefore provides a circuit apparatus having excellent thermal conductivity when semiconductor devices such as the LSI chip 60 and passive elements such as a capacitor and a resistor are mounted thereon and electrically connected to the wiring layers 40.

(Method of Forming Vias)

Figure 3A:
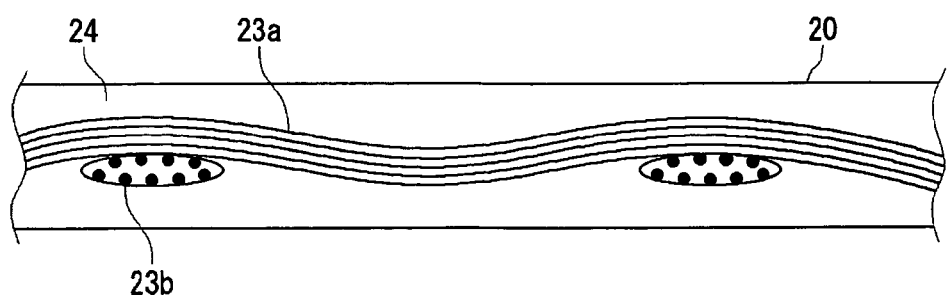
FIG. 3A is a sectional view schematically showing an insulating layer which contains glass cloth.
Figure 3B:
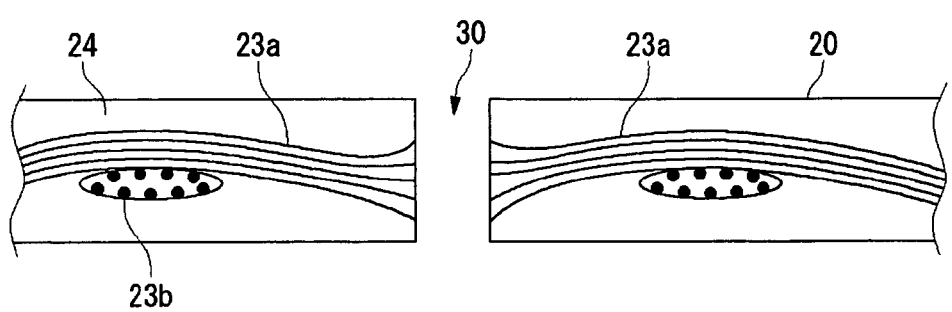
FIG. 3B is a sectional view showing the state where a via is drilled in the insulating layer shown in FIG. 3A.
Figure 3C:
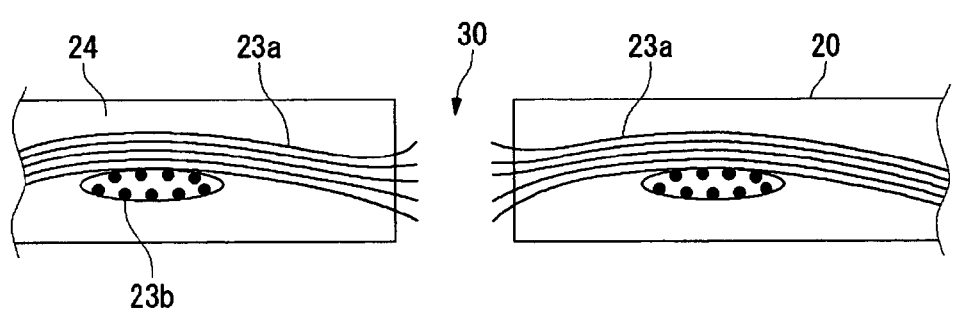
FIG. 3C is a sectional view showing the state where the vicinity of the via shown in FIG. 3B is dissolved.
Figure 3D:
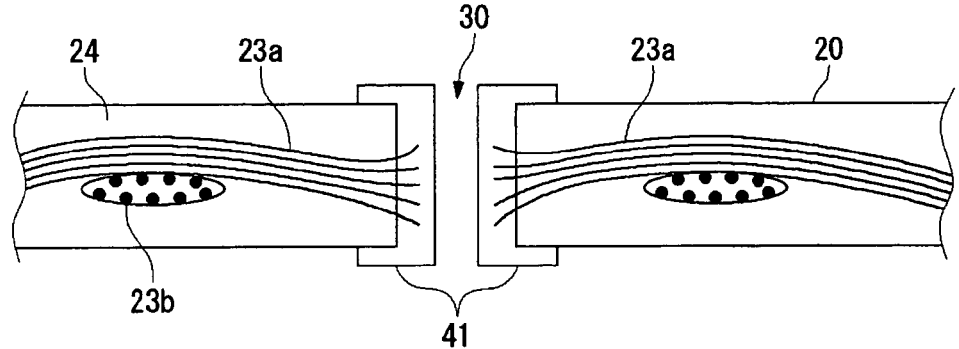
FIG. 3D is a sectional view showing the state where the dissolved via shown in FIG. 3C is plated.

With reference to FIGS. 3A to 3D, a description will now be given of a method of forming the vias 30 in the circuit board 10. FIG. 3A is a sectional view schematically showing an insulating layer which contains glass cloth. FIG. 3B is a sectional view showing the state where a via is drilled in the insulating layer shown in FIG. 3A. FIG. 3C is a sectional view showing the state where the vicinity of the via shown in FIG. 3B is dissolved. FIG. 3D is a sectional view showing the state where the dissolved via shown in FIG. 3C is plated.

As shown in FIG. 3A, the insulating layer 20, in accordance with the first embodiment, contains glass fibers 23a that extend in the horizontal direction of the diagram and glass fibers 23b that extend in the vertical direction of the diagram (hereinafter, the glass fibers 23a and 23b will be collectively referred to as glass fibers 23).

When a via 30 is drilled in a desired position of this insulating layer 20, some of the glass fibers 23 are cut off (see FIG. 3B). In the present embodiment, the drill rotation during machining tends to make the glass fibers protruding from the sidewall oblique to the sidewall. These glass fibers are very likely to have lengths greater than the thickness of the conductor part.

A desmearing process is then performed using a chemical solution (for example, permanganic acid solution) in which the glass fibers 23 are not dissolved, only the insulative resin 24 is. This process eliminates resin residues produced by the drilling of the via, and also eliminates resin at the surface of the sidewall of the via. At the same time, the inorganic material added into the resin layer 20 to provide an enhanced heat radiation capability, or the glass fibers 23 in the case of the first embodiment, will remain undissolved. This makes it possible to expose a greater amount of glass fibers included in the insulating layer, thereby forming glass fibers longer than the thickness of the conductor part.

Consequently, as shown in FIG. 3C, part of the glass fibers 23 contained in the insulating layer 20 protrudes from the sidewall of the via 30.

Next, a thin copper film having a thickness of several hundred nanometers is deposited on the surface of the sidewall of the via 30 by electroless copper plating using palladium as a catalyst. Then, a conductor part 41 is formed by electrolytic plating using a copper sulfate solution as the plating solution (see FIG. 3D). The copper plating film preferably has a thickness of around several tens of micrometers, or even more preferably 10 to 30 μm or so. In the first embodiment, the thickness of the copper plating film is approximately 15 μm.

When the copper plating is thus performed with the glass fibers 23 protruding from the via sidewall, the protruding glass fibers 23 are taken into the copper plating. This can improve the adhesion between the resin included in the insulating layer 20 and the plated conductor part 41. Consequently, it is possible to suppress the exfoliation of the metal film, or conductor part, from the resin and suppress the occurrence of cracks, providing an improvement to the reliability of the circuit board.

Figure 1A:
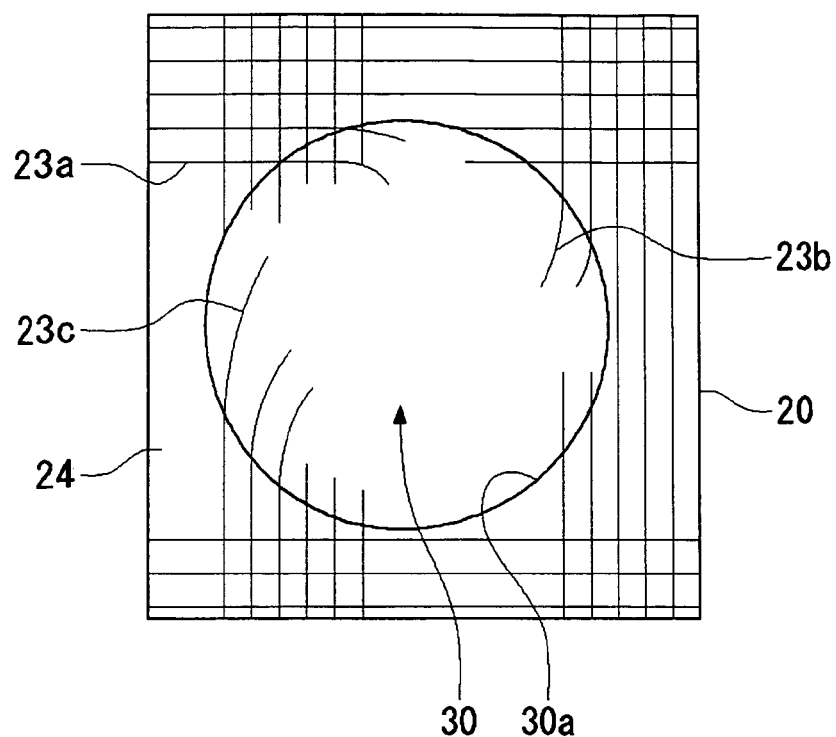
FIG. 1A is a schematic diagram showing an insulating layer, as seen from above, in which a via is formed by drilling.
Figure 1B:
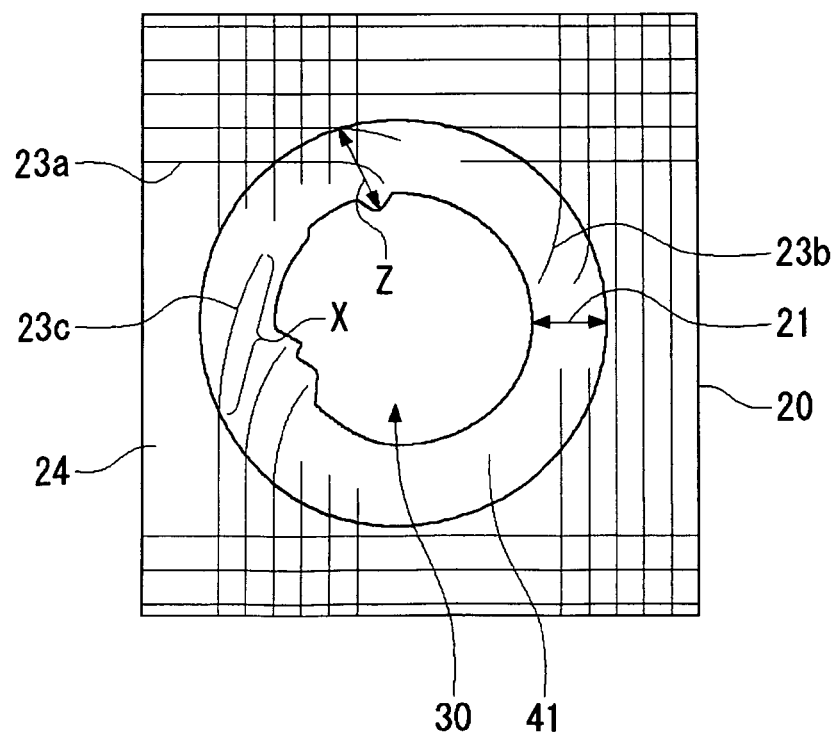
FIG. 1B is a schematic diagram showing the insulating layer, as seen from above, in which the via shown in FIG. 1A is plated.

Now, the above-mentioned phenomenon will be described in detail with reference to FIGS. 1A and 1B. FIG. 1A is a schematic diagram showing the insulating layer, as seen from above, in which a via is formed by drilling. FIG. 1B is a schematic diagram showing the insulating layer, as seen from above, in which the via shown in FIG. 1A is plated.

As shown in FIG. 1A, when a via 30 is drilled in the insulating layer 20, some of the glass fibers 23 protrude from the via sidewall 30a. Since the via 30 is formed with a rotating drill, some of the protruding glass fibers 23 protrude along the via sidewall 30a in a spiral fashion.

When the resin alone is dissolved in this state, the resin area of the sidewall 30a retreats to expose greater lengths of glass fibers 23. After plating, as shown in FIG. 1B, the conductor part 41 therefore covers glass fibers that have lengths X greater than the plating thickness Z. The length X of a glass fiber covered by the conductor part refers to, for example, that of the glass fiber 23c which protrudes from the sidewall 30a as shown in FIG. 1B. The plating thickness Z refers to the thickness normal to the sidewall 30a. In the first embodiment, the plating thickness Z is approximately 15 μm, in which case the conductor part 41 preferably includes glass fibers having lengths X of around 15 to 30 μm.

Consequently, according to the first embodiment, the drill machining and the resin dissolving process make it easier for the conductor part 41 to include glass fibers 23 that have lengths X>the plating thickness Z. As compared to the case where the lengths X of the glass fibers<the plating thickness Z, it is possible to improve the adhesion between the resin and the conductor parts such as wiring, and suppress the exfoliation of metal members such as the wiring.

The first embodiment has dealt with thermal vias (via holes) that pierce through the insulating layer. However, the present invention is not limited thereto. It is possible to achieve the same effect even when recesses are formed in the insulating layer.

In the first embodiment, the plating film need not necessarily have a uniform thickness Z. The plating thickness Z may vary from one location to another, in which case the glass fibers to be included in conductor parts shall have lengths X greater than the smallest thickness Z1.

Second Embodiment (Structure of Circuit Board)

Figure 5:
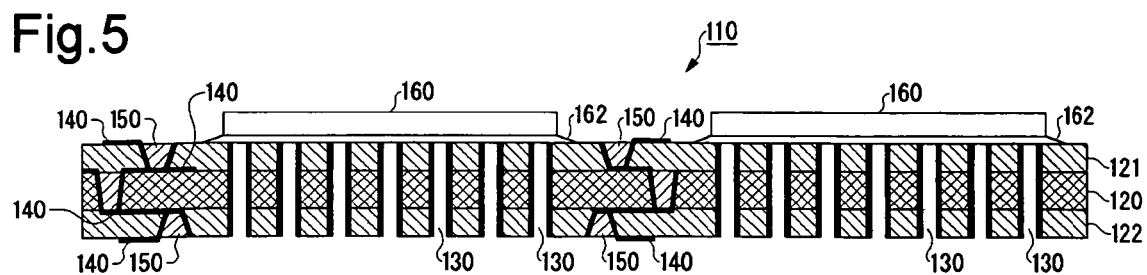
FIG. 5 is a sectional view showing the structure of a multilayer circuit board according to a second embodiment.

FIG. 5 is a diagram showing the structure of a multilayer circuit board 110 according to a second embodiment. The circuit board 110 comprises a plurality of insulating layers 120, 121, and 122, a plurality of thermal vias 130, a plurality of wiring layers 140, and via plugs 150. The thermal vias 130 are formed to pierce through the insulating layers 120, 121, and 122. The wiring layers 140 are formed between the plurality of insulating layers 120, 121, and 122, or on the surfaces of the insulating layers 120. The via plugs 150 establish conduction between the respective wiring layers 140 in the direction perpendicular to the circuit board 110.

The insulating layers 120, 121, and 122 are made of glass cloth that is impregnated with an insulative resin 124. Suitable resins include organic resins such as epoxy resins, melamine derivatives such as BT resin, liquid crystal polymers, PPE resins, polyimide resins, fluorine resins, phenol resins, and polyamide bismaleimides. The glass cloth impregnated with the resin is preferably formed in three layers. In this instance, one single layer refers to a configuration where glass fibers extending in respective different directions cross each other. The three layers thus refer to the state where this unit configuration is stacked up to three stages in the vertical direction.

In the second embodiment, a copper-foiled epoxy resin laminate having a flame-resistant woven glass cloth matrix (such as FR-4) is used. FR-4 has a thermal conductivity of 0.33 W/mK and a withstand voltage of 29 MV/mm (when the applied voltage has a frequency of 50 Hz).

The thermal vias 130 function to allow heat occurring from heating elements arranged on the surface of the circuit board 110, such as LSI chips 160, to emanate to the back side of the circuit board 110. For example, the LSI chips 160 are attached to the insulating layer 121 with a paste 162.

The wiring layers 140 are suitably made of copper wiring formed by plating. The via plugs 150 may also be made of copper, the same material as that of the wiring layers 140. This provides favorable conduction across the interfaces between the via plugs 150 and the wiring layers 140.

The circuit board 110 in accordance with the present embodiment therefore provides a circuit apparatus having excellent thermal conductivity when semiconductor devices such as the LSI chips 160 and passive elements such as a capacitor and a resistor are mounted thereon and electrically connected with the wiring layers 140.

(Method of Forming Vias)

Figure 6A:
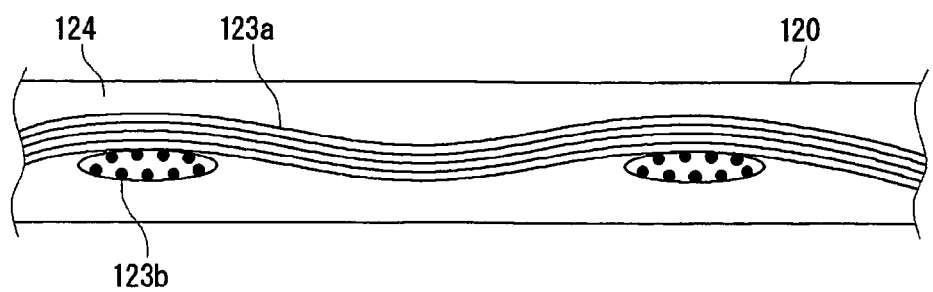
FIG. 6A is a sectional view schematically showing an insulating layer which contains glass cloth.
Figure 6B:
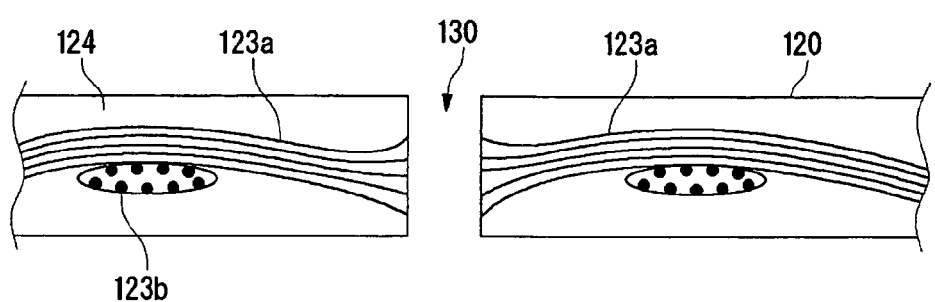
FIG. 6B is a sectional view showing the state where a via is drilled in the insulating layer shown in FIG. 6A.
Figure 6C:
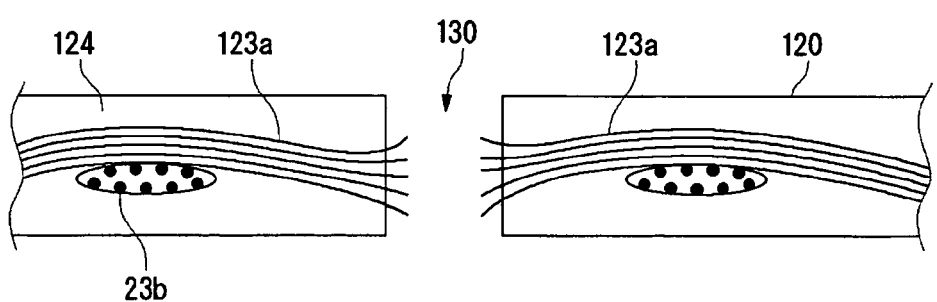
FIG. 6C is a sectional view showing the state where the vicinity of the via shown in FIG. 6B is dissolved.
Figure 6D:
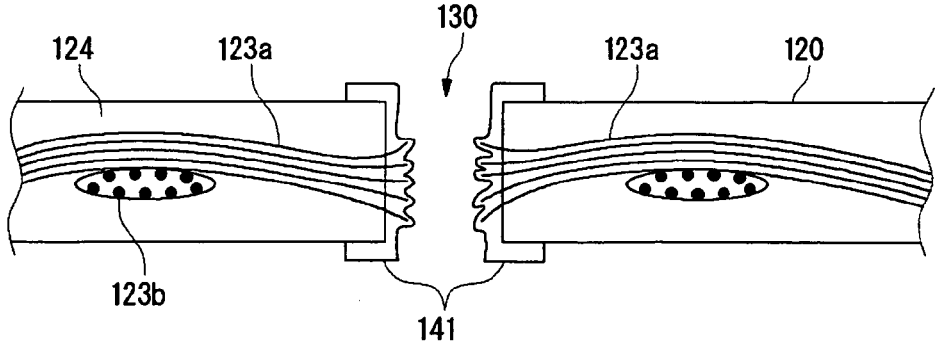
FIG. 6D is a sectional view showing the state where the dissolved via shown in FIG. 6C is plated.

With reference to FIGS. 6A to 6D, a description will be given of a method of forming the thermal vias 130 in the circuit board 110. FIG. 6A is a sectional view schematically showing an insulating layer which contains glass cloth. FIG. 6B is a sectional view showing the state where a via is drilled in the insulating layer shown in FIG. 6A. FIG. 6C is a sectional view showing the state where the vicinity of the via shown in FIG. 6B is dissolved. FIG. 6D is a sectional view showing the state where the dissolved via shown in FIG. 6C is plated.

As shown in FIG. 6A, the insulating layer 120 according to the second embodiment contains glass fibers 123a that extend in the horizontal direction of the diagram and glass fibers 123b that extend in the vertical direction of the diagram (hereinafter, the glass fibers 123a and 123b will be collectively referred to as glass fibers 123).

When a thermal via 130 is drilled in a desired position of this insulating layer 120, some of the glass fibers 123 are cut off (see FIG. 6B). In the second embodiment, the drilling facilitates protrusion of the glass fibers from the sidewall, thereby increasing the surface roughness of the conductor part to be formed later.

Take the situations as described above where the fibrous filler cyclically varies in density, such as when the fibers of the filler are interwoven in a mesh-like configuration and when the fibers of the filler are arranged so as to rise and fall in density at least in one direction. In such cases, the number of fibers of the filler protruding from the sidewall of a drilled thermal via 130 varies from one location to another, so that the density of the fibers varies cyclically.

In this state, a desmearing process is performed using a chemical solution (for example, permanganic acid solution) in which the glass fibers 123 are not dissolved, only the insulative resin 124 is. This process eliminates resin residues produced by the drilling of the thermal via, and also eliminates resin at the surface of the sidewall of the thermal via. Meanwhile, the inorganic material added into the resin layer 120 to provide an enhanced heat radiation capability, or the glass fibers 123 in the case of the second embodiment, will remain undissolved.

Consequently, as shown in FIG. 6C, part of the glass fibers 123 contained in the insulating layer 120 protrude from the sidewall of the thermal via 130.

Next, a thin copper film having a thickness of several hundred nanometers is deposited on the surface of the sidewall of the thermal via 130 by electroless copper plating using palladium as a catalyst. Then, a conductor part 141 is formed by electrolytic plating using a copper sulfate solution as the plating solution (see FIG. 6D). The copper plating film preferably has a thickness of around several tens of micrometers, or even more preferably 10 to 30 μm or so. In the second embodiment, the thickness of the copper plating film is approximately 15 μm.

When the copper plating is thus performed with the glass fibers 123 protruding from the via sidewall, the protruding glass fibers 123 are taken into the copper plating. This can improve the adhesion between the resin included in the insulating layer 120 and the plated conductor part 141. Consequently, it is possible to suppress the exfoliation of the metal film, or conductor part, from the resin and suppress the occurrence of cracks, providing an improvement to the reliability of the circuit board.

Figure 4A:
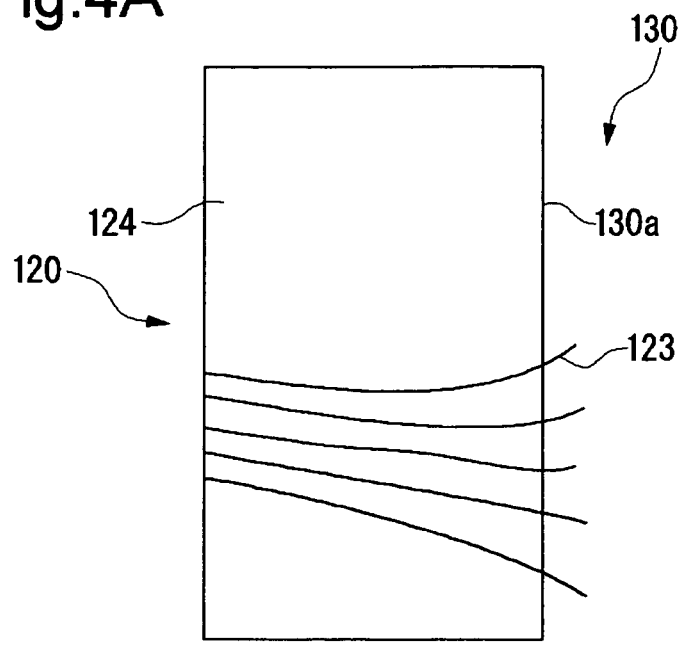
FIG. 4A is a schematic diagram showing how the vicinity of a thermal via in the circuit board according to the second embodiment is dissolved.
Figure 4B:
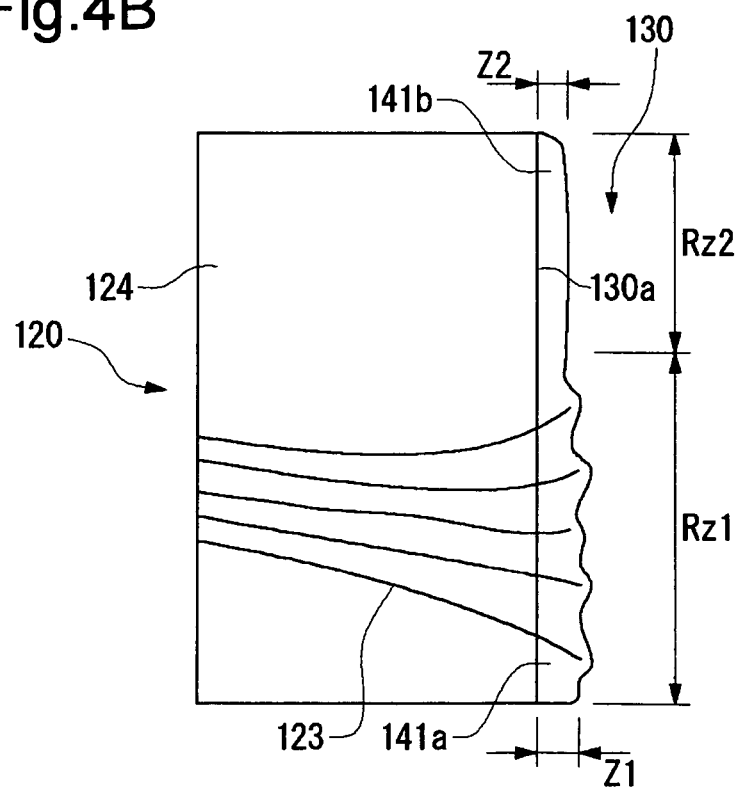
FIG. 4B is a schematic diagram for explaining a difference in roughness after the thermal via shown in FIG. 4A is plated.

The thermal via formed by the foregoing method will now be described in more detail with reference to FIGS. 4A and 4B. FIG. 4A is a schematic diagram showing how the vicinity of a thermal via in the circuit board, in accordance with the second embodiment, is dissolved. FIG. 4B is a schematic diagram for explaining the difference in roughness after the thermal via, shown in FIG. 4A, is plated.

As shown in FIG. 4A, when a thermal via 130 is drilled in the insulating layer 120, some of the glass fibers 123 protrude from the sidewall 130a.

When the resin 124 alone is dissolved in this state, the resin area of the sidewall 130a retreats to expose greater lengths of glass fibers 123. After plating, as shown in FIG. 4B, conductor parts 141a and 141b (hereinafter, conductor parts 141a and 141b will be collectively referred to as a conductor part 141 when necessary) cover the glass fibers.

Suppose that Rz1 is the surface roughness of the conductor part 141a that covers the glass fibers 123 protruding from the sidewall 130a of the thermal via 130 (ten-point height of irregularities: with a reference length L=0.025 mm), and Rz2 is the surface roughness of the conductor part 141b that covers where the glass fibers 123 do not protrude from the sidewall 130a of the thermal via 130. Then, Rz1 and Rz2 have the following relationship:

$$Rz1 > Rz2. \quad \text{(Exp. 1)}$$

In the second embodiment, Rz1=1.73 μm and Rz2=1.35 μm.

This configuration increases the surface area of the conductor part 141a which covers the glass fibers 123, thereby increasing the surface area of the entire conductor part 141 formed on the sidewall 130a of the thermal via 130 providing an enhanced heat radiation capability. This also facilitates the radiation of heat through the glass fibers 123.

Now, suppose that Z1 is the thickness of the conductor part 141a which covers the glass fibers 123 protruding from the sidewall 130a, and Z2 is the thickness of the conductor part 141b which covers the sidewall 130a where the glass fibers 123 do not protrude. Then, Z1 and Z2 have the following relationship:

$$Z1 > Z2. \quad \text{(Exp. 2)}$$

In the second embodiment, Z1=22.5 μm and Z2=20.5 μm.

Such a configuration makes the thickness Z1 of the conductor part 141a, covering the glass fibers 123 protruding from the sidewall 130a, greater than the normal thickness Z2. This can increase the volume of the conductor part 141, providing an enhanced heat radiation capability. In addition to this, a step formed between the regions of different thicknesses can increase the surface area, thereby improving the heat radiation capability further.

Consequently, according to the second embodiment, the drill machining and the resin dissolving process can form two regions in the insulating layer that contains the glass fibers 123 cyclically varying in density and the resin for filling gaps between the glass fibers 123, and therefore insulates the plurality of wiring layers. The two regions include one in which the glass fibers 123 protrude from the sidewall 130a of the thermal via 130 and one in which the glass fibers 123 do not protrude. Accordingly, the individual regions can be plated so that at least the conductor part 141a that covers the glass fibers 123, out of the conductor part 141, has a greater roughness Rz1 than in the other regions. It is therefore possible to increase the surface area of that portion, providing an improved heat radiation capability. Moreover, at least the conductor part 141a that covers the glass fibers 123, out of the conductor part 141, can be given a thickness Z1 greater than the thickness Z2 of the other areas. The volume of the conductor part having high heat conductivity can thus be increased, improving the heat radiation capability further.

Consequently, it is possible to improve the heat radiation capability of the metal or other conductor parts 141 formed in/on the insulating layers 120, 121, and 122 of the circuit board 110, and provide a circuit board 110 capable of even higher integration.

Figure 7:
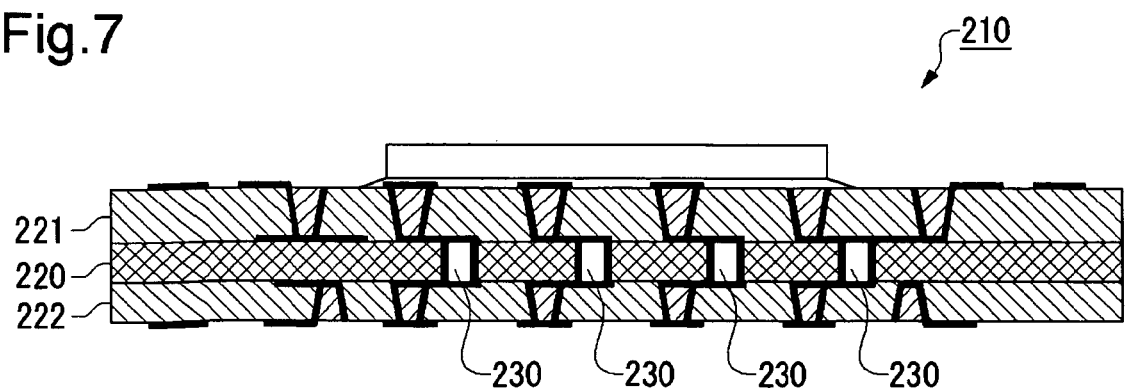
FIG. 7 is a sectional view showing the structure of a multilayer circuit board according to another embodiment.

The second embodiment has dealt with thermal vias (via holes) that pierce through the plurality of insulating layers. However, the present invention is not limited thereto. For example, as in a circuit board 210 shown in FIG. 7, only a center insulating layer 220 out of three insulating layers 220, 221, and 222 may be provided with the same thermal vias 230 as the foregoing thermal vias 130. Even in this case, it is possible to achieve the same effects. Since the inner insulating layer 220 alone, excluding the outermost insulating layers 221 and 222, has the hollow thermal vias 230, it is also possible to suppress moisture penetration from the exterior while improving the heat radiation capability.

It should be appreciated that the present invention is not limited to the embodiments described above, and various modifications including design changes may be made thereto based on the knowledge of those who skilled in the art. All such modified embodiments are also intended to fall within the scope of the present invention.

The foregoing embodiments have dealt with the cases where the wiring layers are formed on both sides of the insulating layers. However, the wiring layers are not limited to this structure. For example, wiring layers may be formed on a single side of the insulating layer. A plurality of wiring layers may also be laminated via a plurality of insulating layers.

Moreover, while the foregoing embodiments have dealt with a plurality of resin insulating layers, a single layer structure is also applicable.

What is claimed is:

1. A circuit board comprising:
   a plurality of wiring layers;
   an insulating layer which insulates the plurality of wiring layers, the insulating layer containing a fibrous filler and a resin; and
   a conductor film on a sidewall of a via hole extending through the insulating layer, and wherein
      the fibrous filler protrudes from the sidewall along the sidewall of the via hole, and the protruding portion of the fibrous filler is covered with the conductor film; and
      the length of the protruding portion of the fibrous filler protruding from the sidewall is greater than the thickness of the conductor film;
      the conductor film has a surface roughness in a region where the conductor film covers the fibrous filler protruding from the sidewall that is greater than a surface roughness in a region where the conductor film covers the sidewall from which the fibrous filler does not protrude;
      the thickness of the conductor film covering the fibrous filler protruding from the sidewall is greater than the thickness of the conductor film covering the side wall from which the fibrous filler does not protrude; and
      the circuit board including a step at a border between the conductor film covering the fibrous filler protruding from the side wall and the conductor film covering the side wall from which the fibrous filler does not protrude.

2. The circuit board according to claim 1, wherein the fibrous filler is a glass fiber.

3. The circuit board according to claim 1, wherein conduction between the plurality of wiring layers and the conductor film is established.

4. The circuit board according to claim 1, wherein the fibrous filler protrudes from the sidewall oblique to a direction of the normal of the sidewall.

5. The circuit board according to claim 2, wherein conduction between the plurality of wiring layers and the conductor film is established.

6. The circuit board according to claim 2, wherein the fibrous filler protrudes from the sidewall oblique to a direction of the normal of the sidewall.

7. The circuit board according to claim 1, wherein the conductor part is a plated conductor film.

* * * * *